US008238868B2

(12) United States Patent
Duan et al.

(10) Patent No.: US 8,238,868 B2
(45) Date of Patent: Aug. 7, 2012

(54) DYNAMIC VOLTAGE SCALING FOR PACKET-BASED DATA COMMUNICATION SYSTEMS

(75) Inventors: Chunjie Duan, Medfield, MA (US); Sinan Gezici, Ankara (TR); Jinyun Zhang, Cambridge, MA (US); Rajesh Garg, College Station, TX (US)

(73) Assignee: Renesas Electronics Corporation, Kanagawa (JP)

( * ) Notice: Subject to any disclaimer, the term of this patent is extended or adjusted under 35 U.S.C. 154(b) by 887 days.

(21) Appl. No.: 11/755,903

(22) Filed: May 31, 2007

(65) Prior Publication Data

US 2008/0297133 A1  Dec. 4, 2008

(51) Int. Cl.
| | |
|---|---|
| H04B 1/16 | (2006.01) |
| H04B 1/04 | (2006.01) |
| H04B 7/00 | (2006.01) |
| H04B 1/38 | (2006.01) |
| H04B 7/212 | (2006.01) |
| G05F 1/577 | (2006.01) |
| G05F 1/38 | (2006.01) |
| G05F 3/02 | (2006.01) |
| B23K 11/24 | (2006.01) |
| H03L 5/00 | (2006.01) |
| H03K 5/08 | (2006.01) |
| H03G 3/20 | (2006.01) |
| H03G 3/10 | (2006.01) |
| G08B 5/22 | (2006.01) |
| H04Q 1/30 | (2006.01) |
| G08C 17/00 | (2006.01) |
| H04L 5/16 | (2006.01) |
| H04L 27/06 | (2006.01) |

(52) U.S. Cl. ............... 455/343.2; 455/127.1; 455/127.5; 455/522; 455/574; 323/267; 323/304; 323/318; 327/306; 327/309; 330/129; 330/281; 340/7.35; 370/311; 370/347; 375/219; 375/341

(58) Field of Classification Search .... 455/127.1–127.5, 455/522, 41.1, 73, 76, 78, 88, 91, 108, 116, 455/118, 121, 126, 147, 165.1, 195.1, 197.1, 455/197.2, 197.3, 234.1, 255, 260, 318, 333, 343.1–343.5, 572, 574; 323/207, 222, 225, 267, 268, 282, 283, 284, 300, 313, 318, 322; 330/281; 341/155; 375/141, 222, 267
See application file for complete search history.

(56) References Cited

U.S. PATENT DOCUMENTS 4,903,335 A * 2/1990 Shimizu ............... 455/343.4
(Continued)

FOREIGN PATENT DOCUMENTS

EP  0 358 166 A2  3/1990
(Continued)

OTHER PUBLICATIONS

Jan Rabaey. *Digital Integrated Circuits*, Prentice Hall, Upper Saddle River, NJ, USA ,1996, pp. 120-150 and pp. 234-252.
R. Gonzalez, B. Gordon, and M. Horowitz. "Supply and Threshold Voltage Scaling for Low Power CMOS," IEEE Journal of Solid-State Circuits, vol. 32, No. 8, Aug. 1997, pp. 1210-1216.
T. Burd, T. Pering, A. Stratakos and R. Bordersen. "A Dynamic Voltage Scaled Microprocessor System," IEEE Journal of Solid-State Circuits, vol. 35, No. 11, Nov. 2000, pp. 1571-1580.

(Continued)

*Primary Examiner* — Matthew Anderson
*Assistant Examiner* — Paul P Tran
(74) *Attorney, Agent, or Firm* — Bunchanan Ingersoll & Rooney PC

(57) ABSTRACT

A dynamic voltage scaling system for a packet-based data communication transceiver includes a constant voltage supply, a variable voltage supply, and a voltage control unit. The constant voltage supply is configured to supply a constant voltage to at least one parameter-independent function of the transceiver, and the variable voltage supply is configured to supply a variable voltage in accordance with a control signal to at least one parameter-dependent function of the transceiver. Parameter-independent transceiver functions perform operations independent of a predetermined parameter and parameter-dependent transceiver functions perform operations dependent on the predetermined parameter The voltage control unit is configured to generate the control signal based on information provided by at least one parameter-independent transceiver function about the predetermined parameter.

23 Claims, 5 Drawing Sheets

U.S. PATENT DOCUMENTS

| | | | |
|---|---|---|---|
| 5,027,428 A * | 6/1991 | Ishiguro et al. | 340/7.35 |
| 6,463,264 B1 * | 10/2002 | Obara | 455/127.2 |
| 6,876,697 B2 * | 4/2005 | Peters et al. | 455/127.1 |
| 7,139,534 B2 * | 11/2006 | Tanabe et al. | 455/108 |
| 7,444,123 B2 * | 10/2008 | Yamawaki et al. | 455/127.2 |
| 2001/0028275 A1 * | 10/2001 | Matsugatani et al. | 330/281 |
| 2002/0071482 A1 | 6/2002 | Peters et al. | |
| 2002/0097817 A1 | 7/2002 | Beerel et al. | |
| 2003/0114124 A1 * | 6/2003 | Higuchi | 455/126 |
| 2004/0185803 A1 | 9/2004 | Tanabe et al. | |
| 2005/0215227 A1 | 9/2005 | Vu et al. | |
| 2006/0246857 A1 * | 11/2006 | Grillo et al. | 455/127.1 |
| 2007/0001889 A1 * | 1/2007 | Garlapati et al. | 341/155 |
| 2007/0060132 A1 * | 3/2007 | Wilhelmsson et al. | 455/445 |

FOREIGN PATENT DOCUMENTS

| | | |
|---|---|---|
| GB | 2 346 492 A | 8/2000 |

OTHER PUBLICATIONS

C. Kim and K. Roy. "Dynamic Vth Scaling Scheme for Active Leakage Power Reduction," IEEE Design, Automation and Test in Europe Conference, Mar. 4-8, 2002, pp. 163-167.

A. Chandrakasan, R. Min, M. Bhardwaj, S.-H. Cho, and A. Wang. "Power Aware Wireless Microsensor Systems," ESSCIRC, Florence, Italy, Sep. 2002, 8 pages.

S. M. Martin, K. Flautner, T. Mudge, and D. Blaauw. "Combined Dynamic Voltage Scaling and Adaptive Body Biasing for Lower Power Microprocessors under Dynamic Workloads," IEEE/ACM, Nov. 10-14, 2002, pp. 721-725.

Standard ECMA-368, "High Rate Ultra Wideband PHY and MAC Standard," 1st Edition, Dec. 2005, 312 pages.

European Search Report, dated Oct. 14, 2011.

\* cited by examiner

DYNAMIC VOLTAGE SCALING FOR PACKET-BASED DATA COMMUNICATION SYSTEMS

FIELD OF THE INVENTION

The present invention generally pertains to transceiver design for packet-based data communication systems. More particularly, the present invention pertains to techniques for reducing transceiver energy consumption in transmitting and/or receiving data packets.

BACKGROUND

Communication systems exist that can support variable data rate by dynamically selecting the best modulation and coding scheme to compensate for channel condition variation and/or upper layer requirement changes. Such systems can implement Adaptive Modulation and Coding (AMC). Exemplary systems include 3G cellular system (3GPP), IEEE 802.11, and WiMedia's multiband orthogonal frequency division multiplexing (MBOFDM) ultra wideband (UWB) system.

Low power consumption is often desirable, and sometimes mandatory, for communication devices. However, communication devices, such as transceivers, are typically designed to support the maximum throughput that the communication system can achieve This requirement for high speed (i.e., high data rate) communication can result in design choices that make optimization of power consumption difficult to achieve. Accordingly, what is needed arc techniques that enable reduction of transceiver power consumption in packet-based data communication systems.

BRIEF SUMMARY

In accordance with an embodiment of the present invention, a dynamic voltage scaling system for a packet-based data communication transceiver includes a constant voltage supply, a variable voltage supply, and a voltage control unit. The constant voltage supply is configured to supply a constant voltage to at least one parameter-independent function of the transceiver, and the variable voltage supply is configured to supply a variable voltage in accordance with a control signal to at least one parameter-dependent function of the transceiver. Parameter-independent transceiver functions perform operations independent of a predetermined parameter and parameter-dependent transceiver functions perform operations dependent on the predetermined parameter. The voltage control unit is configured to generate the control signal based on information about the predetermined parameter provided by at least one parameter-independent, transceiver function.

In accordance with another embodiment of the present invention, a dynamic voltage scaling system for a packet-based data communication transceiver includes means for supplying a constant voltage to at least one parameter-independent function of the transceiver. Parameter-independent transceiver functions perform operations independent of a predetermined parameter. The system further includes means for generating a control signal based on information provided by at least one parameter-independent transceiver function about the predetermined parameter, and means for supplying a variable voltage to at least, one parameter-dependent function of the transceiver in accordance with the control signal. Parameter-dependent transceiver functions perform operations dependent on the predetermined parameter.

In accordance with a further embodiment of the present invention, a method for dynamically scaling voltage for a packet-based data communication transceiver includes supplying a constant voltage to at least one parameter-independent function of the transceiver. Parameter-independent transceiver functions perform operations independent of a predetermined parameter. The method further includes generating a control signal based on information provided by at least one parameter-independent transceiver function about the predetermined parameter, and supplying a variable voltage to at least one parameter-dependent function of the transceiver in accordance with the control signal. Parameter-dependent transceiver functions perform operations dependent on the predetermined parameter.

BRIEF DESCRIPTION OF THE DRAWINGS

Objects and advantages of the present disclosure will be understood by reading the following detailed description in conjunction with the drawings in which.

DETAILED DESCRIPTION

Overview

Figure 1:
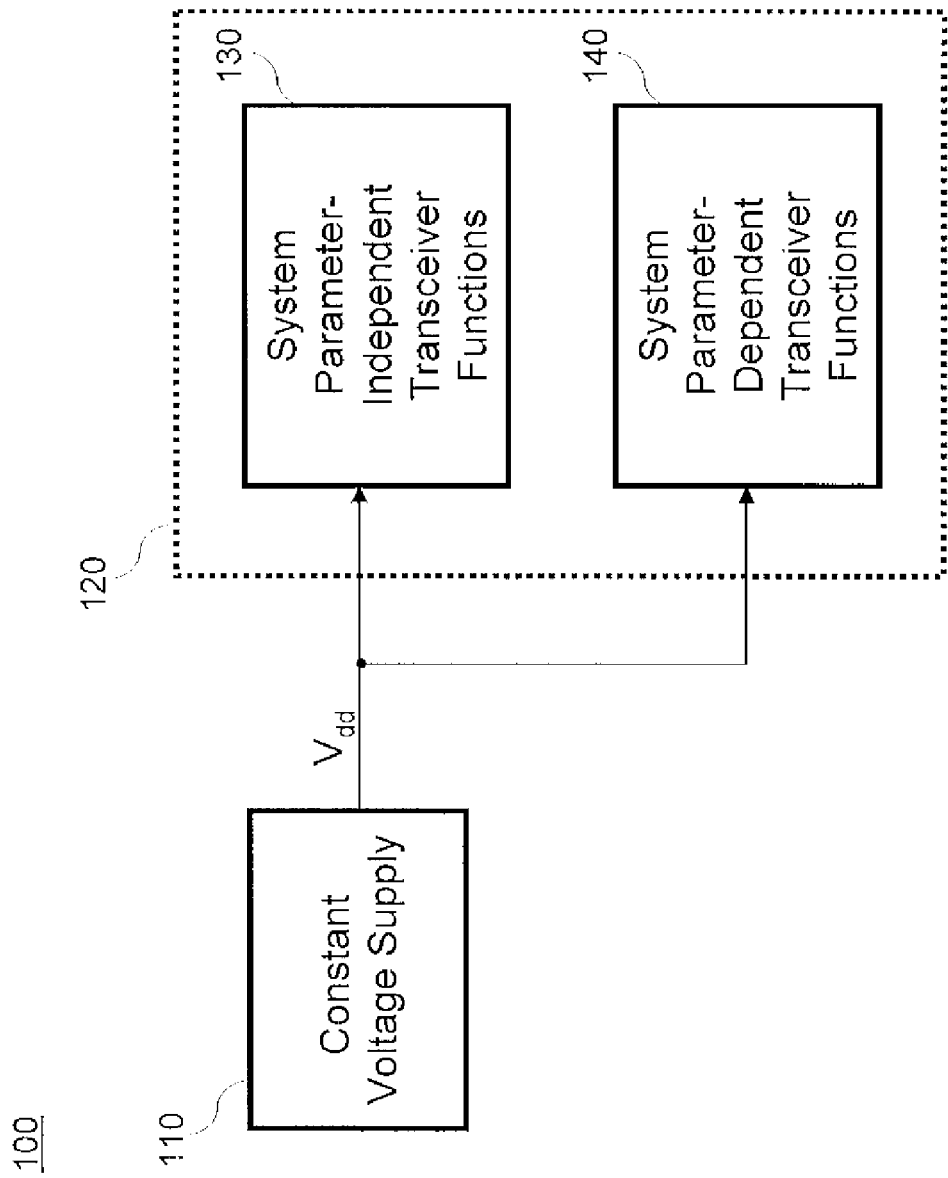
FIG. 1 illustrates a high-level block diagram of a prior art communications system, having a transceiver and a constant voltage supply.

Transceivers can be powered by one or more power supplies that provide constant voltage(s). Such transceivers can be designed to meet peak performance requirements with respect to data rate, coding gain, etc. Thus, even when peak performance is not required, the transceiver can still consume a significant amount of power because the supply voltage(s) remain constant regardless of the instantaneous performance requirements.

Conventional CMOS digital circuitry requires low noise, constant power supply voltage to achieve high noise margin. Thus, transceivers in packet-based data communication systems can be implemented with CMOS circuits that use constant supply voltage. The power consumption of any CMOS circuit can be defined as the sum of dynamic power consumption and static power consumption (See, Rabaey, *Digital Inte-* grated Circuits, Prentice Hall (1996)). The dynamic power consumption for digital circuits can be attributed to the power consumption from switching capacitive loads, whereas the static power consumption can be attributed to current that flows when the circuit is not actively switching due to the finite resistance of the path between the power supply and the ground. For CMOS circuits, the static current is also referred to as "leakage current." The dynamic power consumption for a CMOS gate can be expressed, as $P_{dyn}=C*V_{dd}^2*fclk$, where C is the load capacitance, $V_{dd}$ is the supply voltage and fclk is the clock frequency. The static power consumption can be expressed as $P_{leak\_Ileak}*V_{dd}$, where $I_{leak}$ is the leakage current and $V_{dd}$ is the supply voltage. Thus, the total power consumption for the CMOS gate can be expressed as $P_{total}=P_{leak}+P_{dyn}$, and is strongly dependent on $V_{dd}$.

Techniques exist for scaling down the supply voltage ($V_{dd}$) statically to reduce circuit power consumption. Because the speed of a circuit decreases with lower supply voltage, static voltage scaling techniques can reduce the peak throughput of the circuit.

Techniques also exist for scaling down the supply voltage ($V_{dd}$) dynamically to reduce circuit power consumption. Dynamic voltage scaling (DVS) is one active power management technique for reducing the overall power consumption of a CMOS circuit, where the supply voltage and clock frequency can be adjusted dynamically in response to a circuit throughput requirement. For example, Gonzalez, et al., "Supply and Threshold Voltage Scaling for Low Power CMOS," IEEE J of Solid-State Circuits, Vol. 32 (August 1997) investigate the effect of lowering the supply voltage and provide a first-order model of energy and delay in CMOS circuits, which shows that, lowering the supply and threshold voltage can be advantageous, especially when the transistors of the CMOS circuit are velocity saturated and the nodes have a high activity factor. Burd et al., "A Dynamic Voltage Scaled Microprocessor System," IEEE Journal of Solid State Circuits, Vol. 35 (November 2000) use a microprocessor to compute workload and adaptively scale supply voltage for the entire system. Such systems require an operating system that can intelligently vary the processor speed.

Similar to DVS, a dynamic threshold voltage (VTII) scaling (DVTS) scheme is described in Kim et al., "Dynamic VTII Scaling for Active Leakage Power Reduction," IEEE Design, Automation and Test in Europe Conference, pp. 163-167 (March 2002) to reduce the active leakage power of a circuit. The DVTS technique uses body bias control to control the threshold voltage, and can provide significant power savings.

Both DVS and DVTS schemes are considered for wireless micro-sensor systems in Chandrakasan et al., "Power Aware Wireless Microsensor Systems," ESSCIRC, Florence, Italy (September 2002). Due to the need for long battery life for such systems, scaling of both the supply and the threshold voltage is proposed. Similarly, joint optimization of both DVS and adaptive body biasing (ABB) is considered in Martin et al., "Combined Dynamic Voltage Scaling and Adaptive Body Biasing for Lower Power Microprocessors under Dynamic Workloads," IEEE/ACM, pp. 721-725 (November 2002) to reduce power even when the leakage power is the limiting factor. Martin et al, provide trade-offs between supply voltage and body bias for a given clock frequency and duration of operation, and suggest that the combined voltage and body biasing scaling becomes more effective for deep sub-micron process.

FIG. 1 illustrates a high-level block diagram of a prior art communications system 100 having a transceiver 120 and a constant voltage supply 110, which provides a constant supply voltage $V_{dd}$. The transceiver 120 can be represented as including hypothetical blocks 130 and 140. Hypothetical block 130 can be considered to include the functional blocks of the transceiver 120 that are independent of a given system parameter, while hypothetical block 140 can be considered to include the functional blocks of the transceiver 120 that are dependent on the given system parameter. As shown in FIG. 1, the same supply voltage $V_{dd}$ can be applied to all of the functional blocks of the transceiver 120, regardless of whether they are dependent on the given system parameter.

The system parameter can include, but need not be limited to, data rate, bit error rate (BER), packet, error rate (PER) and transceiver state (e.g., idle, acquiring, synchronizing, and decoding, etc.). As used herein, the term "system parameter-independent" can describe a functional block of a transceiver for which the structure/functionality of the block does not change when the parameter is changed, while "system parameter-dependent" can describe a functional block of the transceiver for which the structure/functionality of the block changes when the parameter is changed, for example, consider a multi band-OFDM UWB system that can operate at various data rates (see, ECMA-368, "High rate ultra wideband PHY and MAC: standard," First Edition (December 2005), available at http://www.ecmainternational.org/publications/files/ECMA-T/ECMA-368.pdf). If data rate is the system parameter of interest, then a synchronizer in the multiband-OFDM UWB transceiver can be considered system parameter-independent because it operates on the preamble section of a packet, which is independent of the packet data rate. On the other hand, a Viterbi decoder in the multiband-OFDM UWB transceiver can be considered system parameter-dependent because it outputs a varying number of bits per second in accordance with the data rate.

Figure 2A:
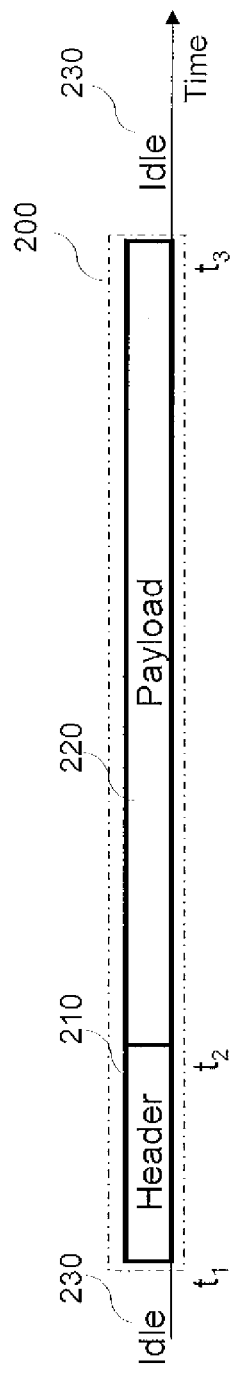
FIG. 2A illustrates an exemplary communications packet having header and payload portions and illustrates idle periods when no packet is transmitted or received.
Figure 2B:
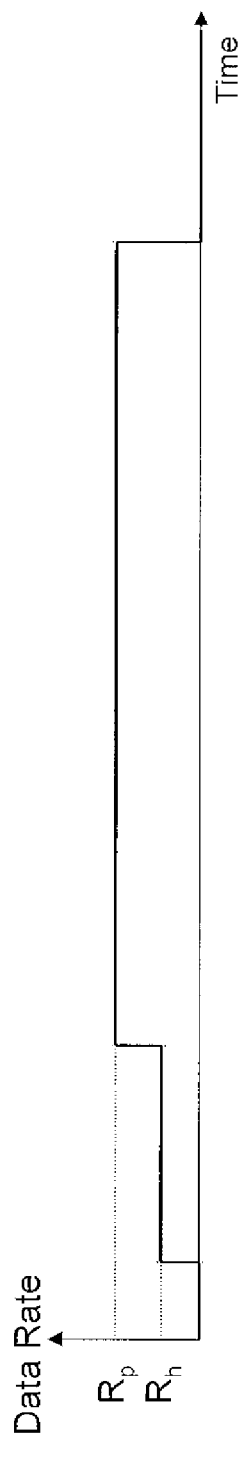
FIG. 2B illustrates data rate for various time instants corresponding to the header and payload portions of the communications packet of FIG. 2A.
Figure 2C:
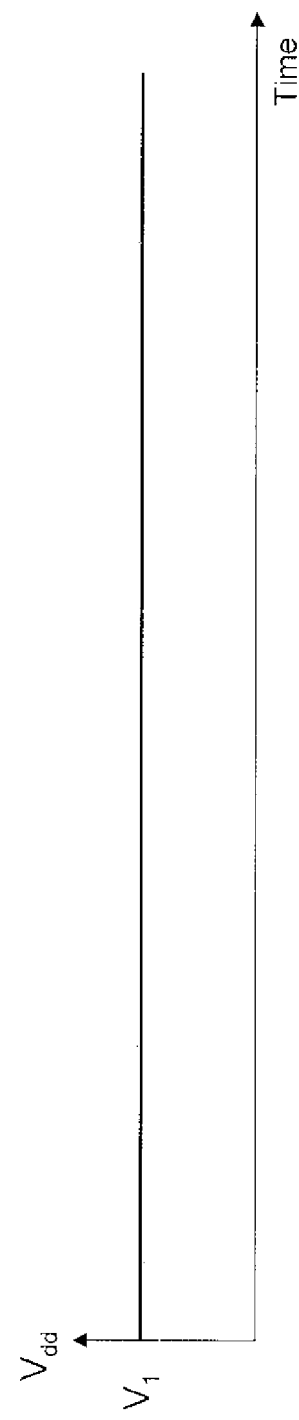
FIG. 2C illustrates a constant voltage supply level applied during each portion of the packet, in accordance with the prior art system of FIG. 1.

FIG. 2A illustrates an exemplary data communications packet 200 having a header portion 210 and a payload portion 220 and illustrates idle periods 230 when no packet is transmitted or received. In FIG. 2A, the packet 200 is transmitted (or received) from time instance $t_1$ until time instance $t_3$. The packet 200 can consist of multiple portions, and the system parameters for different portions of the packet 200 can be different. For example, FIG. 2B illustrates changes in data rate corresponding to the header 210 and payload 220 portions of the communications packet 200. As shown in FIG. 2B, during the header portion 210 (from $t_1$ to $t_2$), the data rate is $R_h$. During the payload portion 220 (from $t_2$ to $t_3$), the data rate is changed to $R_p$. During the idle periods 230 (before $t_1$ and after $t_3$ the data rate is zero. FIG. 2C illustrates a constant voltage supply level applied during each portion of the packet 200, in accordance with the prior art system of FIG. 1. As shown in FIG. 2C, the supply voltage $V_{dd}$ having a constant voltage level $V_1$ can be applied during transmission (or reception) of all portions of the packet 200. In this example, if data rate is the system parameter of interest, the constant voltage level $V_1$ is applied regardless of changes in the data rate.

Dynamic Voltage Scaling for Packet-Based Data Communication Transceiver

A power saving technique based on DVS is described herein to reduce circuit energy consumption by a packet-based data communication transceiver. In an embodiment, voltage can be adjusted adaptively based on a system parameter(s) of interest. In an exemplary implementation, a voltage control unit is proposed that can be configured to obtain information related to the system parameter(s), and control a variable voltage supply to provide variable voltage levels to transceiver functions, the operation of which depends on the system parameter(s). In this way, the proposed scheme can provide a constant voltage level to transceiver functional blocks for which the structure/functionality is independent of the system parameter(s), and variable voltage levels to transceiver functional blocks for which the structure/functionality is dependent on the system parameter(s).

Figure 3:
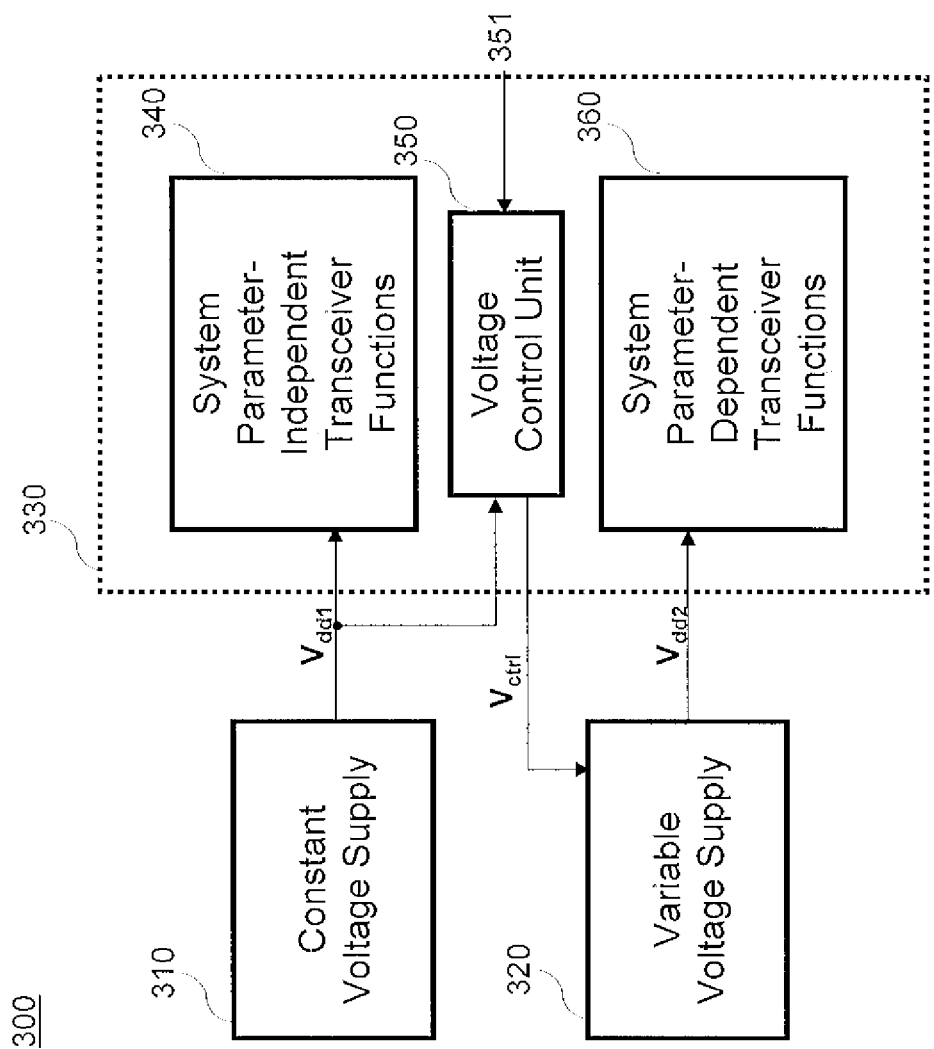
FIG. 3 illustrates a high-level block diagram of a communications system having a transceiver, at least one constant voltage supply, and at least one variable voltage supply in accordance with an embodiment of the present invention.

FIG. 3 illustrates a high-level block diagram of a communication system 300 having a transceiver 330, a constant voltage supply 310, which provides a constant supply voltage $V_{dd1}$, and a variable voltage supply 320, which provides a variable supply voltage $V_{dd2}$, in accordance with an embodiment of the present invention. The transceiver 330 can be represented as including hypothetical blocks 340 and 360, and a voltage control unit 350. Hypothetical block 340 can be considered to include the functional blocks of the transceiver 330 for which the structure/functionality is independent of a given system parameter, while hypothetical block 360 can be considered to include the functional blocks of the transceiver 330 for which the structure/functionality is dependent on the given system parameter. In accordance with an aspect of the present disclosure, the voltage control unit 350 can be implemented in conjunction with a computer-based system, including hardware, software, firmware, or combinations thereof.

As shown in FIG. 3, the constant supply voltage $V_{dd1}$ is supplied to the system parameter-independent block 340 and to the voltage control unit 350 by the constant voltage supply 310. The system parameter-independent block 340 can provide information about the system parameter to the voltage control unit 350 via an information signal 351. For example, the system parameter-independent block 340 can provide information about the data rate, BER, and PER, among other information, obtained from a data communication packet header. The voltage control unit 350 can use the information provided in the information signal 351 about the system parameter to generate a control signal $V_{ctrl}$. The control signal $V_{ctrl}$ can then be used to control the variable supply voltage $V_{dd2}$ output by the variable voltage supply 320 and supplied to the system parameter-dependent block 360. For example, one or more control signals $V_{ctrl}$ can be used to adapt the variable supply voltage $V_{dd2}$ to one or more variable voltage levels in accordance with the system parameter. In this way, system 300 can be adapted to achieve significant power savings for a given performance criterion. Alternatively, system 300 can be adapted to optimize performance for a given power constraint.

Figure 4A:
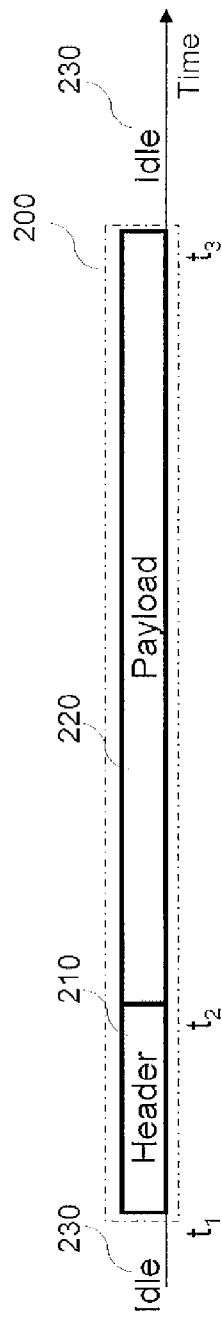
FIG. 4A illustrates a communications packet having header and payload portions and illustrates idle periods when no packet is transmitted or received.
Figure 4B:
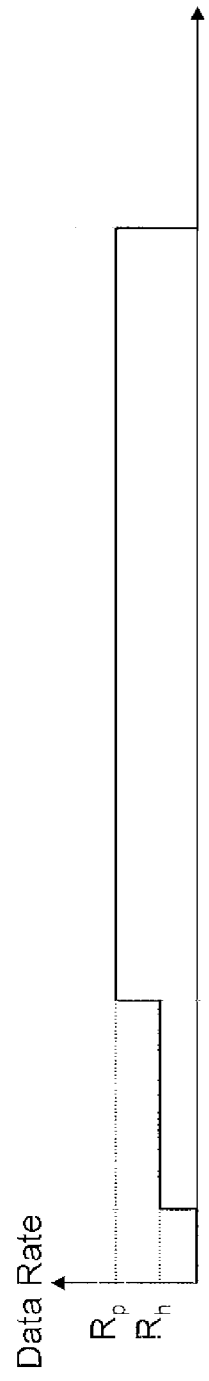
FIG. 4B illustrates data rate for various time instants corresponding to the header and payload portions of the communications packet of FIG, 4A.

FIG. 4A illustrates the exemplary data packet 200, having the header portion 210 and the payload portion 220, and illustrates the idle periods 230 when no packet is transmitted or received. The header portion 210 is transmitted (or received) from time instance $t_1$ to time instance $t_2$, the payload portion 220 from time instance $t_2$ to time instance $t_3$. FIG. 4B illustrates variations in data rate for the different portions of the packet 200. For example, during the idle periods 230 the data rate is zero, during the header portion 210 (from $t_1$ to $t_2$) the data rate is $R_h$, and during the payload portion 220 (from $t_2$ to $t_3$) the data rate is increased to $R_p$.

Figure 4C:
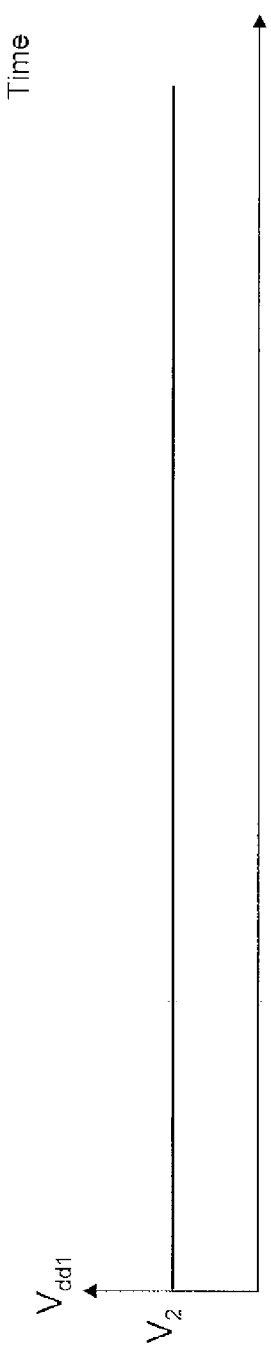
FIG. 4C illustrates a constant voltage supply level and FIG. 4D illustrates variable voltage supply levels applied during the portions of the packet, in accordance with the system of FIG. 3.
Figure 4D:
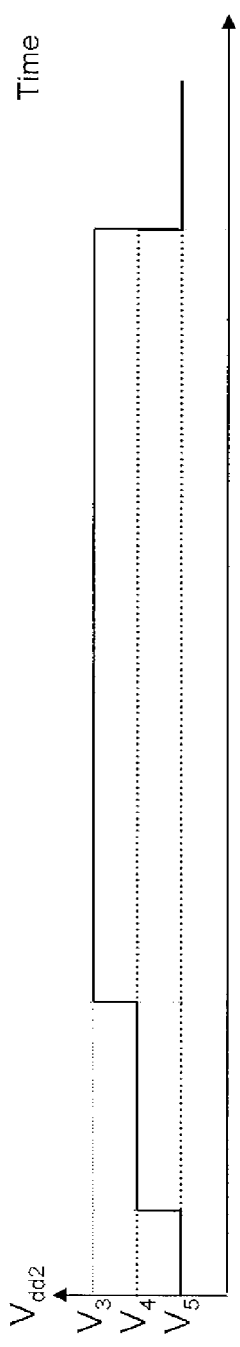

FIG. 4C illustrates a constant voltage supply level and FIG. 4D illustrates variable voltage supply levels applied during portions of the packet 200, in accordance with the exemplary system 300 of FIG. 3. As shown in FIG. 4C, the constant supply voltage $V_{dd1}$ has a constant voltage level $V_2$, which can be applied to parameter-independent functional blocks of the transceiver during transmission (or reception) of all portions of the packet 200. As shown in FIG. 4D, the variable supply voltage $V_{dd2}$ has variable voltage levels $V_3$, $V_4$, and $V_5$, which can be adaptively applied to parameter-dependent functional blocks of the transceiver during transmission (or reception) of the different portions of the packet 200, in accordance with the system parameter(s) of interest.

For example, at the beginning of the packet 200 (at $t_1$), the variable supply voltage $V_{dd2}$ can be adapted to a default voltage level $V_4$. Then, during transmission (or reception) of the header portion 210 of the packet 200 (from $t_1$ to $t_2$), values of the system parameter(s) for subsequent portions of the packet 200 (e.g., payload portion 220) can be determined. These new values of the system parameter(s) can be included in the information signal 351 and used by the voltage control unit 350, shown in FIG. 3, to generate the control signal $V_{ctrl}$ for adapting the variable supply voltage $V_{dd2}$. During the idle periods 230 (before $t_1$ and after $t_3$), the variable supply voltage $V_{dd2}$ can be adapted to the lowest voltage level $V_3$. From $t_1$ to $t_2$, the variable supply voltage $V_{dd2}$ can be increased to $V_4$, which is the voltage level corresponding to the system parameter of the header portion 210. From $t_2$ to $t_3$, the variable supply voltage $V_{dd2}$ can be increased to $V_3$, which is the voltage level corresponding to the new system parameters (e.g., data rate). At $t_3$, the variable supply voltage $V_{dd2}$ can be reset to the lowest voltage level $V_5$. Persons skilled in the art will understand that the variable supply voltage $V_{dd2}$ can be configured to provide more than three or less than three variable voltage levels ($V_3$, $V_4$ and $V_5$) and that the variable supply voltage $V_{dd2}$ can be configured to provide variable voltage levels that are continuous over a range, rather than discrete voltage levels. Further, the voltage control unit 350 can be configured to generate one or more control signal(s) $V_{ctrl}$ for adapting the levels of the variable supply voltage $V_{dd2}$.

In this way, by adapting the variable supply voltage $V_{dd2}$ in accordance with the changing data rates $R_h$ and $R_p$, the packet-based data communication transceiver 300 can use dynamic voltage sealing to optimize power efficiency of the transceiver. Persons skilled in the art will understand that the system parameter of interest need not be limited to data rate and that the variable supply voltage $V_{dd2}$ can be adapted in accordance with other system parameter(s) of interest, such as BER, PER, and transceiver state, among others.

In one embodiment, information for the system parameter(s) of interest is available before dynamic voltage scaling is applied. In this way, the variable voltage level applied to parameter-dependent functional blocks of the transceiver can be adapted in a timely manner. For example, information about the data rate of the header portion 210 of the packet 200 can be predetermined, while information about the data, rate of the payload portion 220 can be provided in the header portion 210 to facilitate timely adaptation of the variable voltage level(s) before transmitting (or receiving) the corresponding portions of the packet. In an alternate embodiment, however, dynamic voltage scaling can be applied even if the values of the system parameter(s) are obtained after they have already changed.

Figure 5:
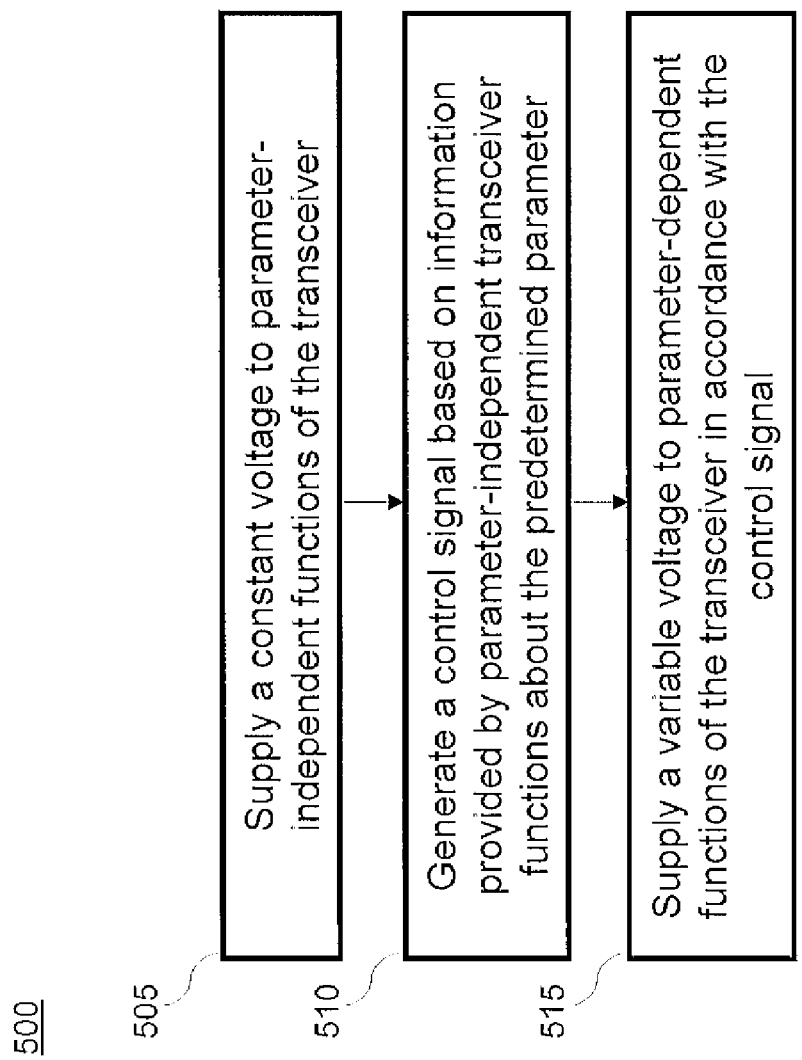
FIG. 5 illustrates a process flowchart providing exemplary steps for dynamically scaling voltage for a packet-based data communication transceiver in accordance with an embodiment of the present invention.

FIG. 5 illustrates exemplary steps for a process 500 for dynamically scaling voltage for a packet-based data communication transceiver. Not all of the steps of FIG. 5 have to occur in the order shown, as will be apparent to persons skilled in the art based on the teachings herein. Other operational and structural embodiments will be apparent to persons skilled in the art based on the following discussion. These steps are described in detail below.

In step 505, a constant voltage is supplied to parameter-independent functions of the transceiver. As described herein, parameter-independent functions of the transceiver can include such functions as synchronization, among others, the structure/functionality of which does not depend on a given system parameter(s) of interest (e.g., data rate, BER, PER, transceiver state, etc.). For example, the constant voltage supply 310 can apply the constant voltage $V_{dd1}$ to one or more of the system parameter-independent functions 340 of transceiver 330, as shown in the embodiment of FIG. 3.

In step 510, a control signal is generated based on information provided by one or more of the parameter-independent transceiver functions about the predetermined parameter(s). As described herein, information about the data rate, or other system parameters of interest, of a payload portion of a transmitted (or received) data communication packet can be obtained from a header portion of the packet. In this way, system parameter-independent transceiver functions that operate on the header portion of the packet can determine the new data rate information, or other system parameter information of interest. This information can then be used to generate a control signal for controlling a variable voltage supply that supplies voltage to parameter-dependent transceiver functions. For example, the voltage control unit 350 can generate the control signal $V_{ctrl}$ based on the information signal 351, which includes the information about the system parameter(s) of interest determined by the system parameter-independent transceiver functions 340, as shown in the embodiment of FIG. 3.

In step 515, a variable voltage is supplied to parameter-dependent, functions of the transceiver in accordance with the control signal. As described herein, parameter-dependent functions of the transceiver can include such functions as decoding, among others, the structure/functionality of which depends on a given system parameter(s) of interest (e.g., data rate, BER, PER, transceiver state, etc.). For example, the variable voltage supply 320 can adapt the variable voltage $V_{dd2}$ in accordance with the control signal $V_{ctrl}$ and supply the variable voltage $V_{dd2}$ to one or more of the system parameter-dependent, transceiver functions 360, as shown in the embodiment of FIG. 3.

Conclusion

The present invention has been described with reference to exemplary embodiments. However, it will be apparent, to those skilled in the art that it is possible to embody the invention in specific forms other than those described above without departing from the spirit of the invention.

Accordingly, the various embodiments described herein are illustrative, and they should not be considered restrictive in any way. The scope of the invention is given by the appended claims, rather than the preceding description, and all variations and equivalents thereof that fall within the range of the claims are intended to be embraced therein.

What is claimed is:

1. A dynamic voltage scaling system for a packet-based data communication transceiver communicating via communication packets, comprising:
    a constant voltage supply configured to supply a constant voltage to at least one parameter-independent function of the transceiver, wherein parameter-independent transceiver functions perform operations independent of a predetermined parameter, the predetermined parameter being attributes associated with the communication packets;
    a variable voltage supply configured to supply a variable voltage in accordance with a control signal to at least one parameter-dependent function of the transceiver, wherein parameter-dependent transceiver functions perform operations dependent on the predetermined parameter; and
    a voltage control unit configured to generate the control signal based on information about the predetermined parameter provided by at least one parameter-independent transceiver function, wherein the parameter-independent transceiver function operates on a preamble portion of a communication packet and includes a synchronization function.

2. The dynamic voltage scaling system of claim 1, wherein the constant voltage supply supplies the constant voltage to each of the parameter-independent functions of the transceiver.

3. The dynamic voltage scaling system of claim 1, wherein the variable voltage supply supplies the variable voltage to each of the parameter-dependent functions of the transceiver.

4. The dynamic voltage scaling system of claim 1, wherein the constant voltage supply supplies the constant voltage to the voltage control unit.

5. The dynamic voltage scaling system of claim 1, wherein the transceiver comprises the voltage control unit.

6. The dynamic voltage scaling system of claim 1, wherein the predetermined parameter includes at least one of data rate, bit error rate, packet error rate, or transceiver state.

7. The dynamic voltage scaling system of claim 1, wherein the parameter-dependent transceiver function operates on a payload portion of the communication packet.

8. The dynamic voltage supply of claim 7, wherein the parameter-dependent transceiver function includes a decoding function.

9. The dynamic voltage scaling system of claim 7, wherein the information provided by the parameter-independent transceiver function about the predetermined parameter is obtained from the preamble portion of the communication packet.

10. The voltage scaling system of claim 9, wherein for an individual communication packet received by the transceiver, the variable voltage supply adapts the variable voltage supplied to the parameter-dependent transceiver function in accordance with the control signal to decrease the variable voltage during reception of the preamble portion and to increase the variable voltage during reception of the payload portion.

11. A dynamic voltage scaling system for a packet-based data communication transceiver communicating via communication packets, comprising:
    means for supplying a constant voltage to at least one parameter-independent function of the transceiver, wherein parameter-independent transceiver functions perform operations independent of a predetermined parameter, the predetermined parameter being attributes associated with the communication packets;
    means for generating a control signal based on information provided by at least one parameter-independent transceiver function about the predetermined parameter; and
    means for supplying a variable voltage to at least one parameter-dependent function of the transceiver in accordance with the control signal, wherein parameter-dependent transceiver functions perform operations dependent on the predetermined parameter, wherein the parameter-independent transceiver function operates on a preamble portion of a communication packet and includes a synchronization function.

12. A method for dynamically scaling voltage for a packet-based data communication transceiver communicating via communication packets, comprising:
    supplying a constant voltage to at least one parameter-independent function of the transceiver, wherein parameter-independent transceiver functions perform operations independent of a predetermined parameter, the predetermined parameter being attributes associated with the communication packets;

generating a control signal based on information provided by at least one parameter-independent transceiver function about the predetermined parameter; and supplying a variable voltage to at least one parameter-dependent function of the transceiver in accordance with the control signal, wherein parameter-dependent transceiver functions perform operations dependent on the predetermined parameter, wherein the parameter-independent transceiver function operates on a preamble portion of a communication packet and includes a synchronization function.

13. The method of claim 12, wherein the step of supplying a constant voltage further comprises:

supplying the constant voltage to each of the parameter-independent functions of the transceiver.

14. The method of claim 12, wherein the step of supplying a variable voltage further comprises:

supplying the variable voltage to each of the parameter-dependent functions of the transceiver.

15. The method of claim 12, wherein the step of generating a control signal comprises:

generating a control signal based on information about at least one of data rate, bit error rate, packet error rate, or transceiver state.

16. The method of claim 12, wherein the parameter-dependent transceiver function operates on a payload portion of the communication packet.

17. The method of claim 16, wherein the step of generating a control signal comprises:

generating a control signal based on information obtained from the preamble portion of the communication packet.

18. The method of claim 17, wherein for an individual packet received by the transceiver, the step of supplying a variable voltage comprises:

decreasing the variable voltage supplied to the parameter-dependent transceiver function in accordance with the control signal during reception of the preamble portion; and increasing the variable voltage supplied to the parameter-dependent transceiver function in accordance with the control signal during reception of the payload portion.

19. The dynamic voltage scaling system of claim 1, wherein the parameter-independent transceiver function is continuously supplied with a constant voltage level from at least a start of processing of a communication packet by the transceiver to an end of the processing of the communication packet by the transceiver.

20. The dynamic voltage scaling system of claim 1, wherein the variable voltage supply maintains the variable voltage at a constant voltage level during processing of a payload portion of the communication packet by the transceiver and adjusts the variable voltage during processing of another portion of the communication packet by the transceiver.

21. The dynamic voltage scaling system of claim 1, wherein the at least one parameter-independent function of the transceiver includes a first portion of the transceiver for which an output of the first portion of the transceiver does not change in response to values of the predetermined parameter changing.

22. The dynamic voltage scaling system of claim 21, wherein the at least one parameter-dependent function of the transceiver includes a second portion of the transceiver, exclusive of the first portion, for which an output of the second portion of the transceiver changes in response to values of the predetermined parameter changing.

23. The dynamic voltage scaling system of claim 22, wherein the voltage level supplied by the variable voltage supply to the second portion of the transceiver is controlled as a function of the values of the predetermined parameter that are associated with the communication packets sent or received by the packet-data communications transceiver.

* * * * *